United States Patent
Andricacos et al.

(10) Patent No.: US 6,224,690 B1
(45) Date of Patent: *May 1, 2001

(54) FLIP-CHIP INTERCONNECTIONS USING LEAD-FREE SOLDERS

(75) Inventors: Panayotis Constantinou Andricacos, Croton-on-Hudson; Madhav Datta, Yorktown Heights, both of NY (US); Hariklia Deligianni, Edgewater, NJ (US); Wilma Jean Horkans, Ossining, NY (US); Sung Kwon Kang, Chappaqua, NY (US); Keith Thomas Kwietniak, Highland Falls, NY (US); Gangadhara Swami Mathad, Poughkeepsie, NY (US); Sampath Purushothaman; Leathen Shi, both of Yorktown Heights, NY (US); Ho-Ming Tong, Taipei (TW)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/614,984

(22) Filed: Mar. 12, 1996

Related U.S. Application Data

(60) Provisional application No. 60/009,183, filed on Dec. 22, 1995.

(51) Int. Cl.[7] ............................................. C22C 7/00
(52) U.S. Cl. .................... 148/400; 257/738; 257/751; 257/753; 257/766
(58) Field of Search ............................. 420/459, 562, 420/557; 257/738, 751, 753, 766, 772, 778, 781; 428/620, 667; 437/183, 189, 190, 192; 148/400

(56) References Cited

U.S. PATENT DOCUMENTS

| | | | | |
|---|---|---|---|---|
| 4,806,309 | * | 2/1989 | Tulman | 420/562 |
| 5,376,584 | * | 12/1994 | Agarwala | 437/183 |
| 5,393,489 | * | 2/1995 | Gonya et al. | 420/561 |
| 5,634,268 | * | 6/1997 | Dalal et al. | 29/840 |

FOREIGN PATENT DOCUMENTS

| | | | |
|---|---|---|---|
| 6-344180 | * | 12/1994 | (JP) . |
| 7-51883 | * | 2/1995 | (JP) . |
| 9534401 | * | 12/1995 | (WO) . |

OTHER PUBLICATIONS

Raman, K.S et al, "Spreading Characteristics of Some Solders on Stainless Steel," Metals Miner. Rev. (1971), 10(8), 7–11 (abstract only).*

* cited by examiner

*Primary Examiner*—Sikyin Ip
(74) *Attorney, Agent, or Firm*—Casey P. August, Esq.; IBM Corporation; Ohlandt, Greeley, Ruggiero & Perle, LLP

(57) ABSTRACT

An interconnection structure suitable for the connection of microelectronic circuit chips to packages is provided by this invention. In particular, the invention pertains to the area-array or flip-chip technology often called C4 (controlled collapse chip connection). The structure comprises an adhesion/barrier layer deposited on a passivated substrate (e.g., a silicon wafer), optionally an additional adhesion layer, a solderable layer of a metal selected from the group consisting of Ni, Co, Fe, NiFe, NiCo, CoFe and NiCoFe on the adhesion/barrier layer, and a lead-free solder ball comprising tin as the predominate component and one or more alloying elements selected from Bi, Ag, and Sb, and further optionally including one or more elements selected from the group consisting of Zn, In, Ni, Co and Cu.

12 Claims, 4 Drawing Sheets

PRIOR ART

FLIP-CHIP INTERCONNECTIONS USING LEAD-FREE SOLDERS

CROSS REFERENCE TO RELATED APPLICATIONS

The present application claims priority to co-pending U.S. Provisional Application 60/009,183 filed Dec. 22, 1995.

FIELD OF THE INVENTION

The field of the present invention is the interconnection of microelectronic circuit chips to packages, in particular the area-array or flip-chip technology often called C4 (controlled collapse chip connection). The present invention further pertains to interconnection schemes that are environmentally acceptable because they use lead-free solder alloys and employ environmentally benign fabrication processes. Additionally, the present invention pertains to interconnection schemes that eliminate sources of soft errors in on-chip circuitry through the elimination of alpha-particle sources in the solder in contact with the microelectronics circuit.

BACKGROUND OF THE INVENTION

In the packaging of semiconductor chips, a hierarchy of interconnections is necessary. At the level of the interconnection between the chip and the substrate (or chip carrier), three different interconnection technologies are widely employed: tape automated bonding (TAB), wirebonding, and area array.

The area array is often called a flip-chip connection or C4. Since the C4 technology uses an array of solder bumps that can be placed over the entire surface area of the chip, it can achieve a higher density of input/output interconnections and better power dissipation than can wirebonding or TAB, which confine the interconnections to the chip periphery.

More specifically, the C4 technology uses solder bumps deposited on a solder-wettable layered structure known as the ball-limiting metallurgy (BLM) on the chip. After the solder pads are reflowed to form balls, they are joined to a matching footprint of solder-wettable layers on the chip carrier. It is the face-down placement of the chip on the carrier that has led C4 technology to be called flip-chip joining. Compared to other methods of interconnection, the C4 technology offers distinct advantages, including the following: 1) shorter interconnect distances, allowing faster signal response and lower inductance; 2) more uniform power and heat distribution; 3) reduced simultaneous switching noise; and 4) greater design flexibility.

Fabrication of PbSn C4 interconnections by evaporation through a metal mask has been practiced since the mid-1960s. The evaporated C4 technology has been developed and perfected since the mid-1960s as a highly reliable, high-density packaging method; it has proved extendible from the earliest products through the products of the 1990s, but the limit of extendibility to larger wafer sizes and more dense arrays has nearly been reached.

For larger wafers, evaporated C4 technology is expensive because of the high capital costs entailed in evaporators large enough to produce good deposit thickness uniformity. In addition to the capital cost, there is the cost of waste and recycling. Typically, in large evaporators, only 5% of the evaporated metal is deposited on the wafer. The rest is deposited on the evaporator wall and on the metal mask, which need to be cleaned. Also, the lead-containing waste material has to be treated as hazardous waste for recycling and disposal.

The usefulness of evaporation to produce interconnections in smaller dimensions and denser arrays is also limited by the inability to produce metal masks with sufficiently high aspect ratios and because the mismatch in the thermal expansion coefficients of the wafer and the mask causes problems. Furthermore, because of the low vapor pressure of tin, it is impossible to extend the evaporated C4 technology to the tin-based lead-free solders that are envisioned for future interconnections.

An alternative method to evaporation is electrochemical fabrication of C4s, which is a selective and efficient process. Electrochemical C4 fabrication has been reported in the literature by, for example, Yung in U.S. Pat. No. 5,162,257, which is incorporated herein by reference. These authors, however, give little attention to issues of reliability and manufacturability. Manufacturability and other integration issues of electrochemically fabricated C4s have been described by Datta, et al. in the J. Electrochem. Soc., 142, 3779 (1995), which is incorporated herein by reference. Using plating and etching processes, and through the development of sophisticated tools, it is possible to obtain a high degree of compositional and volume uniformity of electroplated solders, uniform dimensions of the ball-limiting metallurgy (BLM), and a controlled BLM edge profile.

The electrochemical process is more extendible to larger wafers and to finer C4 dimensions than the evaporated C4 technology. Electrodeposition through a photoresist mask produces solder only in the mask opening (and on any auxiliary electrodes), the deposition is highly efficient, and little waste is generated. Electrodeposition, in contrast to evaporation, is also extendible to high-tin alloys.

FIG. 1 shows a generic C4 structure and its necessary components. The electroplated C4 consists of all of the elements beginning with the ball-limiting metallurgy (hereinafter the "BLM"). The layers of the BLM provide a barrier between the device and the interconnection structure, provide for adhesion of the interconnection structure to the silicon-wafer substrate (on which the device has been fabricated), and provide a solderable layer. The materials in the BLM are chosen to be compatible with the solder alloys and with each other, to give good performance in the C4 joint, and to allow easy fabrication.

A summary of the elements comprising an electrochemically fabricated C4 and the manner in which these elements are assembled follows.

1) With reference to FIG. 1, the first layer to be deposited in the C4 is the adhesion/barrier layer of the BLM which provides adhesion to the underlying substrate while also preventing any interaction of the silicon wafer and its circuitry with the overlying interconnection structure. This barrier is a thin layer typically deposited by sputtering on the passivated wafer. Good barrier layers for use with lead-bearing solders are sputtered Cr or sputtered TiW, typically on the order of a thousand angstroms in thickness.

2) The next layer of the BLM is a second adhesion layer (or "glue" layer), which provides good adhesion between the barrier layer and the solderable layer. This layer may be a "phased CrCu" material consisting of co-sputtered Cr and Cu that is high in Cr at the barrier layer interface and high in Cu at the solderable metal interface. This layer is typically on the order of a thousand angstroms in thickness.

3) The final layer of the BLM is the solderable layer. The solderable layer in a typical 97Pb3Sn C4 structure is copper, typically a few thousand angstroms in thickness, deposited by sputtering.

4) The C4 pattern is defined on the wafer with an appropriate photoresist of thickness at least as great as the thickness of the solder pad to be formed.

5) The solder is electroplated through the mask.

6) After the preceding steps are completed, the photoresist is removed.

7) The BLM is formed by a combination of selective electroetching and chemical etching of the blanket metal layers.

8) The solder is reflowed. Reflow is done in a forming gas atmosphere ($H_2/N_2$) in a belt furnace or in a vacuum furnace. During reflow, the intermetallic compounds form that provide good mechanical integrity at the boundary of the solder and the solderable layer.

9) The wafer is diced into chips, which are joined to a carrier through the use of a suitable flux.

The present invention focuses on cost-effective, environmentally sound, reliable, lead-free replacements for the solders in C4 joints. The present invention also provides the enabling processes for fabrication of an integrated C4 structure, i.e., the selection of the BLM and the deposition and etching processes used to produce the final BLM structure. The current C4 technology, in order to meet the demands of the chip packaging, uses solders that are high in lead, typically 95 to 97% lead by weight. A lead-free C4 requires a solder with similar melting properties, in order to fit into the solder hierarchy.

The elimination of lead from electronic solders is desirable because of the toxicity of lead. The use of lead-free solders also provides a means of limiting the soft errors in circuitry that are caused by alpha particle emission from within the solder.

A few lead-free solders are already available commercially as pastes or for use in wave soldering. The highest-performance lead-free solders, intended for replacement both of high-melting high-lead lead-tin solder and of low-melting, tin-lead eutectic solder, are disclosed in U.S. Pat. Nos. 5,368,814, 5,328,660, 5,411,703, 5,344,607, and 5,414,303: Sn(42–50)Bi(46–56)Cu(2–4)In(1–2)Ag(1–2), Sn(78)Bi(9.8)In(9.8)Ag(2), Sn(93–94)Sb(2.5–3.5)Bi(1.5–2.5)Cu(1–2), and Sn(70–90)Bi(2–10)In(8–20). These materials have all been prepared by bulk metallurgical methods.

The technology for electroplated lead-free solders is presently limited. U.S. Pat. No. 5,308,464 discloses electroplated tin-bismuth of the eutectic composition. Eutectic tin-bismuth is a low-melting solder (having a melting point of 138° C., which is lower than that of tin-lead eutectic), and thus this composition is not suitable for many C4 applications. Canadian Patent 1,333,377 discloses the use of an electroplated tin-bismuth alloy in an application for which this low-melting solder is applicable, i.e., on a printed wiring board.

The most likely candidates for high-melting lead-free solders are tin alloys with a few weight percent of silver, bismuth, or antimony, as disclosed by Kang and Sarkhel, J. Electronic Materials, 28, 701 (1994). The binary alloys do not appear to have the required mechanical properties and resistance to thermal fatigue, thus it is necessary to employ ternary, quaternary, and possibly even higher alloys in C4 joints.

The advantages of electroplating that have been demonstrated for high-lead lead-tin C4 structures, and its potential extendability to tin-based solders, make electroplating a strong contender as the technology of choice for depositing lead-free solders. There is, however, no existing art for electroplating of the high-melting lead-free solders. Some of the likely combinations of metals, e.g., tin with silver, are difficult to deposit by electroplating because of the widely differing nobilities of the two metals.

Those solders not easily deposited as alloys may be produced by a sequence of steps. Any series of electroplating, exchange plating, or electroless deposition steps may possibly be used to deposit the solder components in the correct proportions. Because there is a reflow step prior to joining, these are alloyed during the reflow.

SUMMARY OF THE INVENTION

An interconnection structure suitable for the connection of microelectronic circuit chips to packages is provided by this invention. In particular, the invention pertains to the area-array or flip-chip technology often called C4 (controlled collapse chip connection). The structure sequentially comprises an adhesion/barrier layer deposited on a passivated substrate (e.g., a silicon wafer), optionally an additional adhesion layer, a solderable layer of a metal selected from the group consisting of Ni, Co, Fe, NiFe, NiCo, CoFe and NiFeCo and a lead-free solder ball comprising tin as the predominate component and one or more alloying elements selected from Bi, Ag, and Sb, and further optionally including one or more elements selected from the group consisting of Zn, In, Ni, Co and Cu.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

In accordance with the present invention, the preferred adhesion layer is sputtered TiW at a thickness of about 1000 Å. The thickness of the adhesion layer can vary widely as long a both good adhesion and good barrier properties are maintained. Since the blanket TiW must be etched as the final step in forming the BLM, the film thickness should be minimized consistent with adequate performance. An alternative adhesion layer is sputtered Cr at a thickness of about 1000 Å.

One embodiment, as depicted in FIGS. 2(a) and 2(b), does not employ a glue layer. Elimination of the second adhesion layer (glue layer) requires good adhesion between the barrier layer and the solderable layer. As an alternative, a glue layer can be employed. The glue layer employed in the structures depicted in FIGS. 2(c) and 2(d) is a sputtered phased layer of CrCu having thicknesses ranging between about 1000 and 1500 Å.

The solderable layer in a typical 97Pb3Sn C4 structure, copper, is not suitable as a solderable layer for lead-free solders because of their high tin content. Tin-copper intermetallics form at the interface between copper and a high-tin solder. When the solder is tin-based, these compounds can consume all of the Cu solderable layer in the thin-film C4 structures, leading to a failure in the integrity of the structure. Thus, a metal other than copper must be used as the solderable layer of the BLM in a lead-free C4. In the making of this invention, it has been found that suitable solderable layers are nickel, cobalt, iron and alloys of these metals, such as NiFe, CoFe, NiCo or NiCoFe. Palladium reacts even more rapidly than copper with high-tin alloys and is not a suitable solderable metal. Precious metals like Pt and Au are less feasible than the iron-group metals and their alloys because of cost. Further, Au also rapidly forms an undesirable intermetallic compound with tin.

Figure 3:
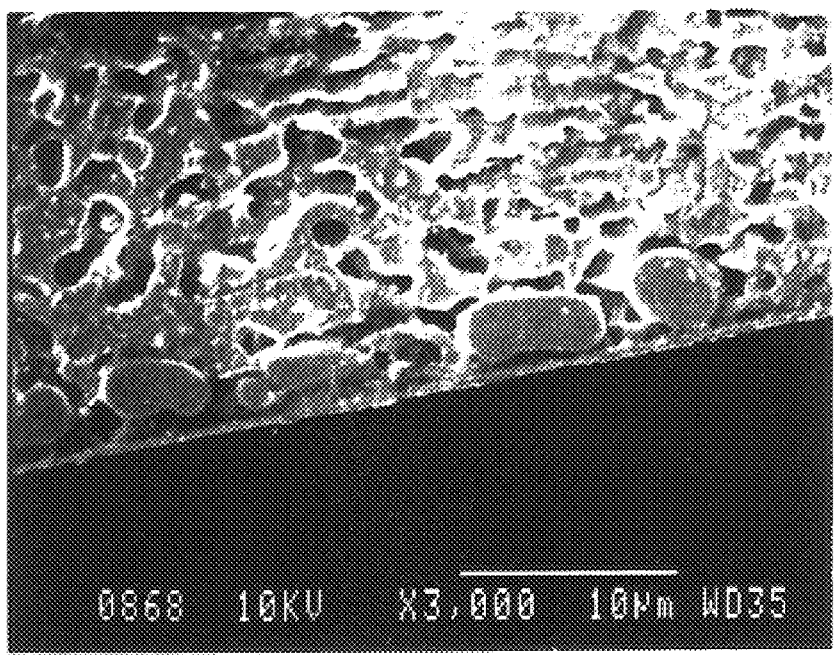
FIG. 3 shows the reaction of Sn—Pb eutectic solder with a BLM of TiW/CrCu/Cu.
Figure 4:
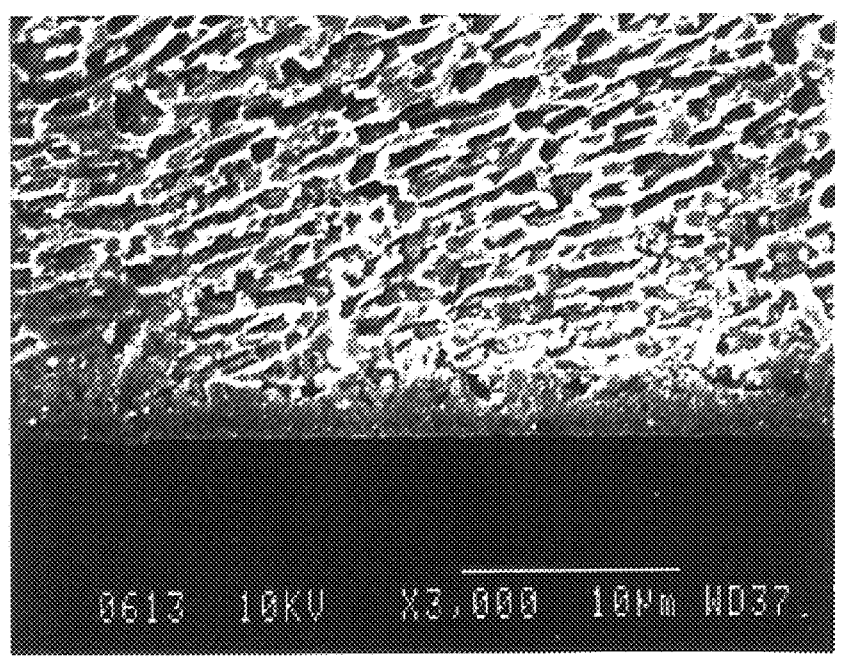
FIG. 4 shows the reaction of Sn—Pb eutectic solder with a BLM of TiW/CrCu/Cu with an additional 0.5 μm of Ni.
Figure 5:
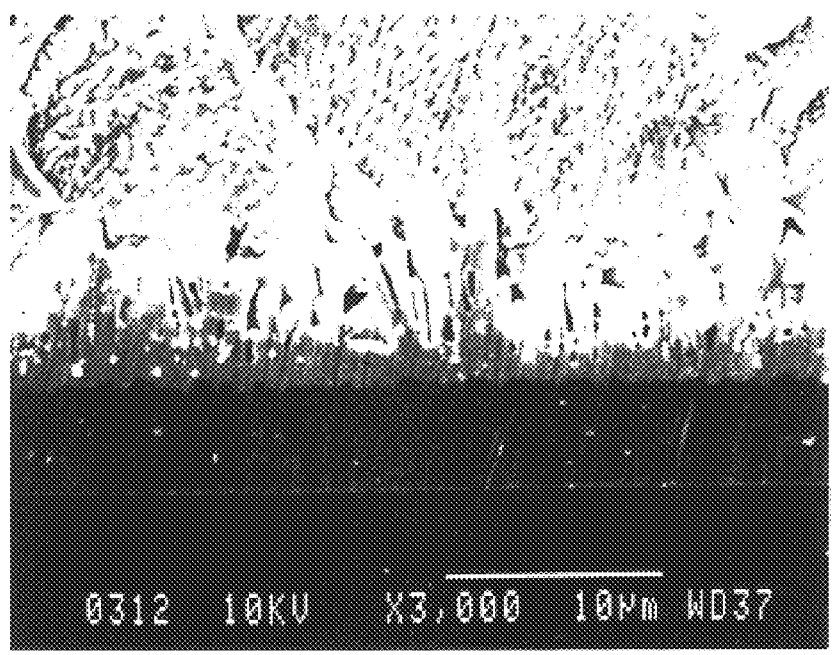
FIG. 5 shows the reactions of electroplated NiCo with high-Sn solder upon reflow.
Figure 6:
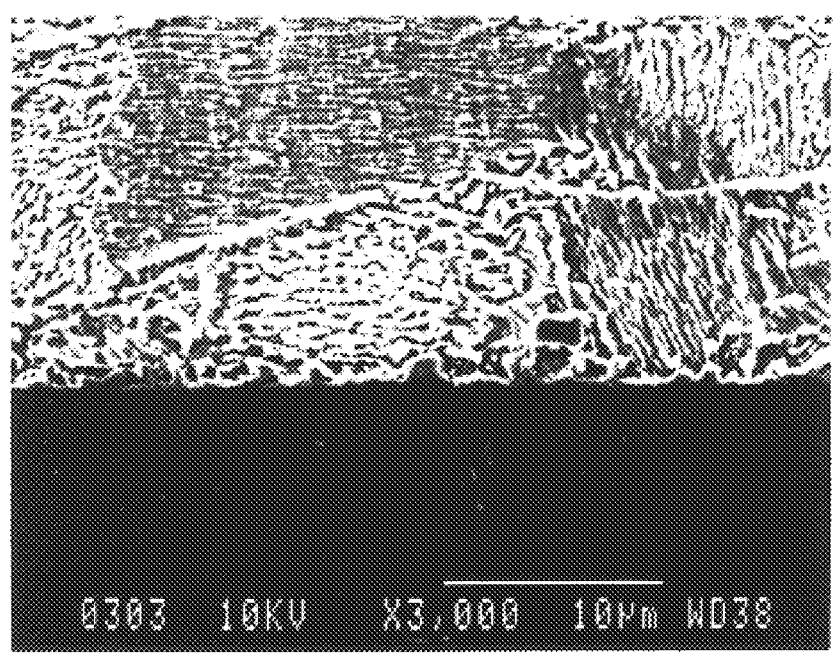
FIG. 6 shows the reactions of electroplated NiFe with high-Sn solder upon reflow.

The preferred solderable layer depicted in FIGS. 2(a) through 2(d) is NiFe of composition about 50Ni50Fe. The low reactivity of nickel with tin-rich solders, compared to copper, is shown in FIGS. 3 and 4. The low reactivity of NiFe alloys with tin-rich solders, compared to nickel, is shown in FIGS. 5 and 6.

FIG. 3 shows a SnPb eutectic solder (60Sn40Pb) paste on a substrate on which has been sputtered TiW/CrCu/Cu, the Cu film having a thickness of 4 µm, after a 2 minute reflow at 215° C. A substantial amount of copper-tin intermetallic is formed under these conditions, and it is seen to be located away from the solder-BLM interface.

In the structure shown in FIG. 4, the TiW/CrCu/Cu sandwich has been coated with a Ni film 0.5 µm thick. Although a nickel-tin intermetallic is formed, it does not spall off or lose adhesion at the copper-nickel interface. Further, it prevents the reaction of the solder with the underlying copper. Nickel would thus be a more suitable solderable layer in the BLM than copper.

The extent of reaction with the solder can be further reduced by adding iron to the solderable layer. FIGS. 5 and 6 show the reaction of a high-tin tin-silver eutectic (96.5Sn3.5Ag) solder with electroplated layers, 5 µm thick, of 50Ni50Fe and of 50Ni50Co after 2-minute reflows at 250° C. The reaction rate of 50Ni50Fe is less than that of 50Ni50Co and is also significantly less than that of pure nickel (FIG. 4). The low level of reaction between the solderable layer and the high-tin solder can be achieved with up to 80% nickel by weight in the electroplated nickel-iron solderable layer. A nickel-iron alloy with the composition 90Ni10Fe has been found to behave similarly to pure Ni. In alloys with less than about 50% by weight iron, there is very little increase over pure nickel in the susceptibility to corrosion.

Figure 1:
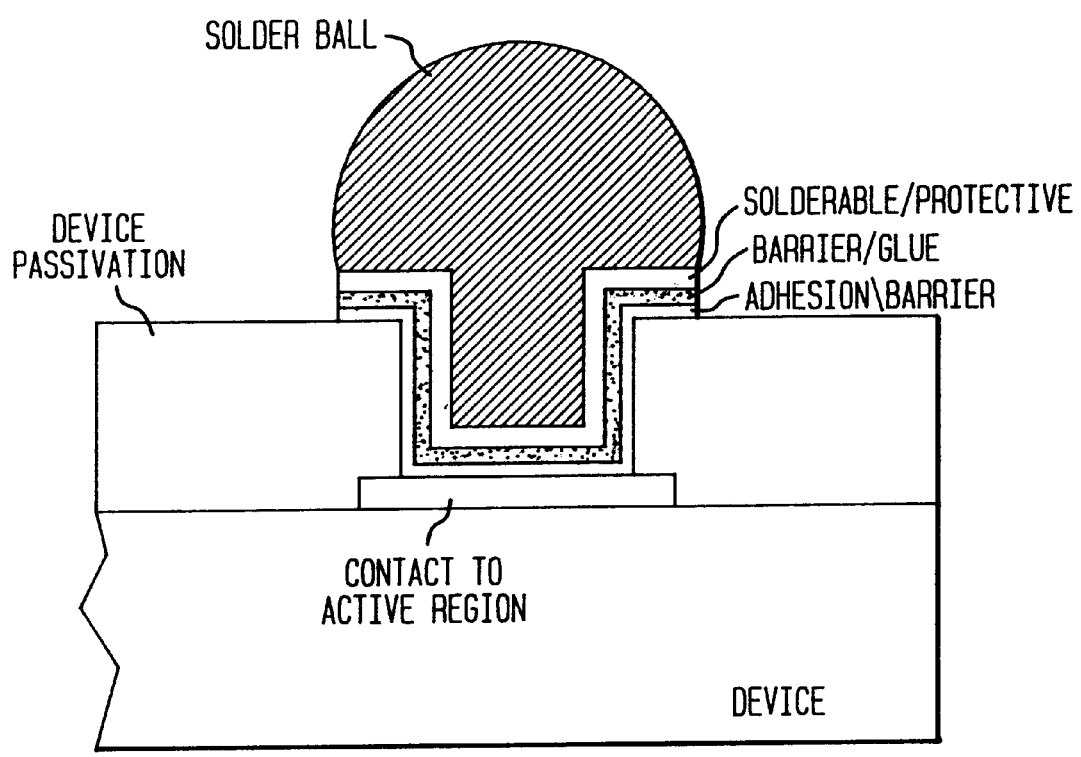
FIG. 1 shows a generic C4 structure.

At present, the solderable layer is sputtered as a blanket film using the same procedure as the sputtering of the other BLM layers. The blanket films must subsequently be patterned to form the BLM in the finished structure depicted in FIG. 1.

If instead the solderable layer is plated through the resist pattern prior to solder plating, then the etch step required to pattern this layer is eliminated from the process flow. It is not possible to electroplate directly on TiW, Cr, or CrCu, and thus there must be a protective layer to allow the solderable layer of the BLM to be plated. Since this layer serves only as protection, it can be very thin (100 to 1000 Å). The thin protective layer can be any metal on which NiFe (or the alternative solderable layers) can be plated and that has good adhesion to the photoresist. The preferred metals for the protective layer are Ni or NiFe alloys. The solderable layer (preferably NiFe) is subsequently plated through the mask to a thickness on the order of 0.5 to 5.0 µm.

The preferred lead-free solder of the present invention is a tin-based binary, ternary, or higher alloy wherein the alloying components in the tin matrix may be one of more of the following as shown in Table I:

TABLE I

| Matrix | Alloying Metal | Preferred Value (% by weight) | Range (% by weight) |
|---|---|---|---|
| Sn | one of | | |
| | Bi | 5 | 1–20 |
| | Ag | 3.5 | 1–5 |
| | Sb | 5 | 1–10 |
| Sn | one or more of | | |
| | Bi | | 1–20 |
| | Ag | | 1–5 |
| | Sb | | 1–10 |
| Sn | one of | | |
| | Bi | 5 | 1–20 |
| | Ag | 3.5 | 1–5 |
| | Sb | 5 | 1–10 |
| | plus one or more of | | |
| | Zn | | 0.5–5 |
| | In | | 0.5–10 |
| | Ni | | 0.5–5 |
| | Co | | 0.5–5 |
| | Cu | | 0.5–5 |
| Sn | one or more of | | |
| | Bi | | 1–20 |
| | Ag | | 1–5 |
| | Sb | | 1–10 |
| | plus one or more of | | |
| | Zn | | 0.5–5 |
| | In | | 0.5–10 |
| | Ni | | 0.5–5 |
| | Co | | 0.5–5 |
| | Cu | | 0.5–5 |

The melting properties of the resulting solder alloy must be consistent with the requirements of the C4 application. This constraint limits the preferred alloys to those with compositions near the tin-silver eutectic (which contains 3.5% silver by weight), to high-tin tin-bismuth alloys and to high-tin tin-antimony alloys. The tin-silver eutectic has a melting point of 232° C. and is suitable for this application. High-tin tin-bismuth alloys also melt in a suitable range. The Sn—Bi phase diagram suggests, however, that alloys with bismuth concentrations above perhaps 20% by weight will, upon reflow, separate into a tin-rich phase and the tin-bismuth eutectic. For this reason, the preferred embodiment employs tin-bismuth solders with bismuth contents below about 10% by weight. Tin-antimony alloys with antimony contents of less than about 5% by weight also have suitable melting ranges for C4 applications.

The preferred deposition method for the solder is electrodeposition—either direct electrodeposition of the alloy or sequential deposition of the alloy components—or a combination of electrodeposition and exchange plating.

Both silver and bismuth are considerably more noble than tin, and thus tin-silver and tin-bismuth alloys are difficult to electroplate, since the major component of the alloy is the less noble metal. In the case of tin-silver alloys, deposition has usually been achieved from cyanide electrolytes. Cyanide complexes the Ag⁺ ion, bringing the reversible potential of silver closer to that of tin and thus allowing codeposition of the two metals; these electrolytes function in the basic pH range and, besides being highly toxic, are not compatible with photoresist materials. Without a strong silver-ion complexant like cyanide, it is difficult not only to co-deposit tin and silver, but even to dissolve them in the same electrolyte. Because of the strong oxidizing power of the silver ion and the existence of two oxidation states of tin, there is a strong driving force for the following reaction, which leads to the decomposition of the solution:

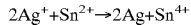
$$2Ag^+ + Sn^{2+} \rightarrow 2Ag + Sn^{4+}$$

With the use of appropriate addition agents, the codeposition of Sn and Bi has been achieved.

For alloys meeting certain criteria, it is not necessary to electroplate the minor component of the alloy. If the minor component is sufficiently more noble than tin, and if its required concentration in the alloy is sufficiently low, it can be deposited by the exchange reaction with tin:

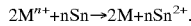
$$2M^{n+} + nSn \rightarrow 2M + nSn^{2+}.$$

Several of the higher-melting, lead-free solder alloys meet the criteria for fabrication by this technique of exchange deposition of the lesser component on pure tin. Two favored alloys for higher-melting, lead-free solders—a tin-silver eutectic (3.5% by weight silver) and low-bismuth tin-bismuth alloys (less than about 10% bismuth by weight)—can be produced by this technique of exchange plating, as well as by sequential electroplating, followed by mixing upon reflow.

The invention is not limited to tin-silver and tin-bismuth alloys. It is probable that these binary alloys will not have the required solder properties for C4 joining and long-term reliability and that C4 solders will need to be ternary, quaternary, and even higher alloys. Additional third or fourth alloying elements can also be sequentially deposited by either the electroplating or exchange plating methods, as appropriate.

Figure 2:
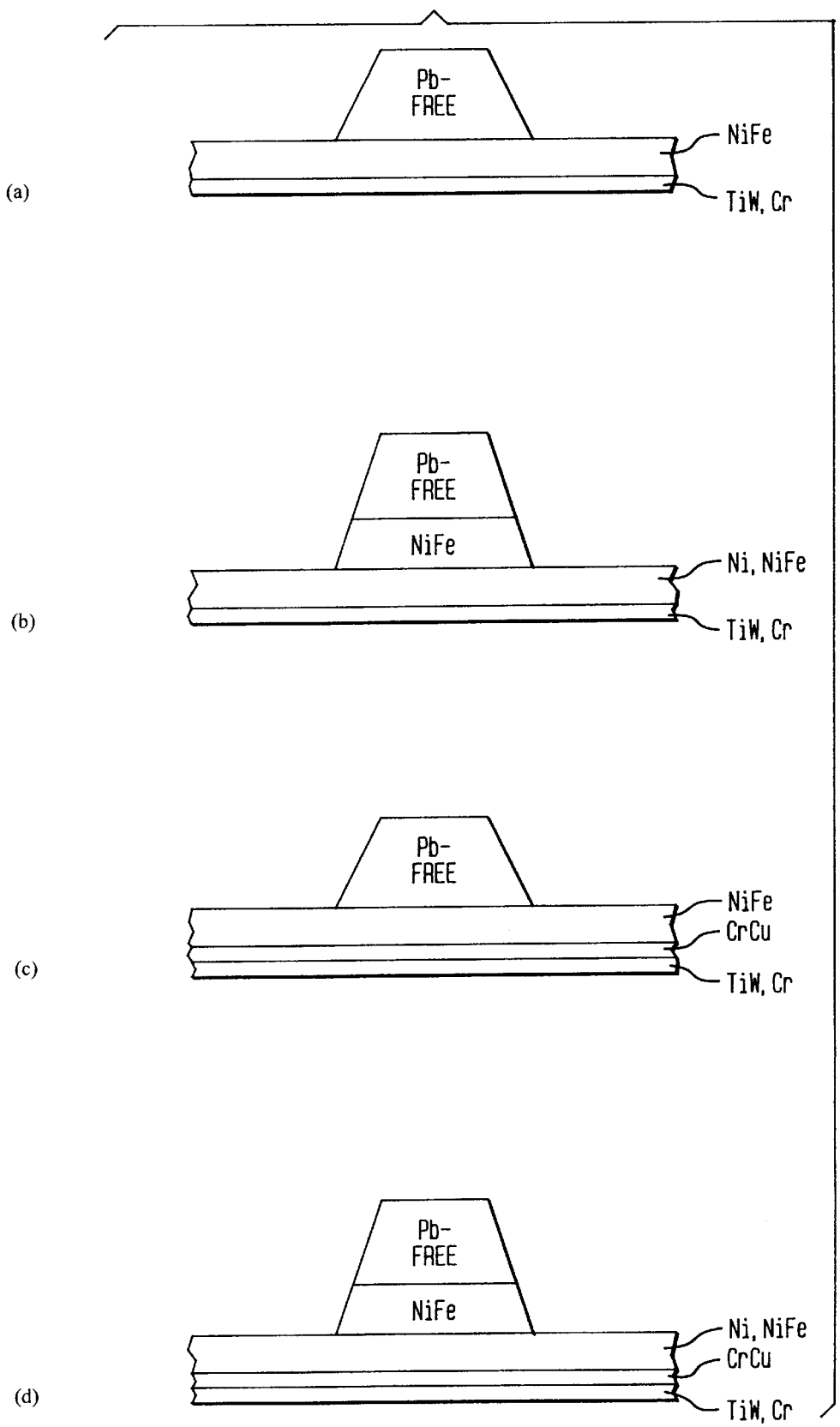
FIGS. 2(a)–2(d) shows a first embodiment (a), a second embodiment (b), a third embodiment (c) and a fourth embodiment (d) of electroplated C4 structures, after removal of the photoresist but before etching to form the BLM.

Four electroplated Pb-free C4 structures of the invention are shown in FIG. 2. The making of those structures will now be described. The four structures are, from top to bottom of FIG. 2:

(a) A plated lead-free solder pad on a BLM consisting of either a TiW or a Cr barrier layer and a NiFe solderable layer. The NiFe thickness must be sufficient such that all of the material will not be dissolved in the solder after solder reflow; the remaining material provides adhesion to the intermetallic formed with the solder and to the barrier metal and also provides a reliable electrical conduction path to the underlying circuitry on the chip. The fabrication of this structure is accomplished through the following steps:

On the passivated chip, which has vias to Al(Cu) or Cu pads, a blanket barrier layer of TiW or Cr is deposited by sputtering.

A blanket NiFe layer about 0.5 $\mu$m to 5.0 $\mu$m thick is sputtered over the barrier layer.

The C4 pattern is defined on the wafer with an appropriate photoresist of thickness at least as great as the thickness of the plated solder.

The lead-free solder is electroplated through the resist mask. Sequential electroplating of the solder components, followed by mixing upon reflow, is an alternative to direct plating of the alloy.

The resist is removed.

The NiFe is removed by selective electroetching or chemical etching.

The TiW or Cr is removed by chemical etching or by reactive ion etching (RIE) or ion-milling.

The solder is reflowed in an appropriate atmosphere.

The wafer is diced into chips, which are joined to a carrier employing a suitable flux.

(b) A lead-free solder pad plated on a NiFe stud which has been plated on a BLM consisting of either a TiW or a Cr barrier layer and either a Ni or a NiFe protective layer. The thickness of the plated NiFe must be sufficient such that all of the material will not be dissolved in the solder reflow. The blanket Ni or NiFe can be thin; this layer serves to protect the TiW or Cr surface and provides adhesion between the barrier metal and the photoresist. The electroplated NiFe provides adhesion to the intermetallic formed with the solder and also provides a reliable electrical conduction path to the underlying circuits on the chip. The fabrication of this structure is accomplished through the following steps:

On the passivated chip, which has vias to Al(Cu) or Cu pads, a blanket barrier layer of TiW or Cr is deposited by sputtering.

A blanket Ni or NiFe layer about 0.01 $\mu$m to 0.1 $\mu$m thick is sputtered over the barrier layer.

The C4 pattern is defined on the wafer with an appropriate photoresist of thickness at least as great as the combined thicknesses of the plated NiFe stud and the plated solder.

A NiFe stud of about 0.5 $\mu$m to 5.0 $\mu$m in thickness is electroplated through the photoresist mask.

The lead-free solder is electroplated through the resist mask on the NiFe stud. Sequential electroplating of the solder components, followed by mixing upon reflow, is an alternative to direct plating of the alloy.

The resist is removed.

The thin blanket Ni or NiFe is removed by selective electroetching, chemical etching, RIE or ion milling.

The TiW or Cr is removed by chemical etching or by RIE or ion milling.

The solder is reflowed in an appropriate atmosphere.

The wafer is diced into chips, which are joined to a carrier employing a suitable flux.

(c) A plated lead-free solder pad on a BLM consisting of a TiW or a Cr barrier layer, a CrCu glue layer, and a NiFe solderable layer. The fabrication of this structure is accomplished through the following steps:

On the passivated chip, which has vias to Al(Cu) or Cu pads, a blanket barrier layer of TiW or Cr is deposited by sputtering.

A blanket CrCu layer is deposited on the TiW layer by sputtering.

A blanket NiFe layer about 0.5 $\mu$m to 5.0 $\mu$m thick is sputtered over the CrCu layer.

The C4 pattern is defined on the wafer with an appropriate photoresist of thickness at least as great as the thickness of the plated solder.

The lead-free solder is electroplated through the resist mask. Sequential electroplating of the solder components, followed by mixing upon reflow, is an alternative to direct plating of the alloy.

The resist is removed.

The blanket NiFe and the CrCu are removed by selective electroetching, chemical etching, RIE or ion milling.

The TiW or Cr is removed by chemical etching or by RIE or ion milling.

The solder is reflowed in an appropriate atmosphere.

The wafer is diced into chips, which are joined to a carrier employing a suitable flux.

(d) A lead-free solder pad plated on a NiFe stud, which has been plated on a BLM consisting of a TiW or a Cr barrier layer, a CrCu glue layer, and either a Ni or a NiFe protective layer. The fabrication of this structure is accomplished through the following steps:

On the passivated chip, which has vias to Al(Cu) or Cu pads, a blanket barrier layer of TiW or Cr is deposited by sputtering.

A blanket CrCu layer is deposited on the TiW layer by sputtering.

A blanket Ni or NiFe layer about 0.01 μm to 0.1 μm thick is sputtered over the CrCu layer.

The C4 pattern is defined on the wafer with an appropriate photoresist of thickness at least as great as the combined thicknesses of the plated NiFe stud and the plated solder pad.

A NiFe stud of about 0.5 μm to 5.0 μm in thickness is electroplated through the photoresist mask.

The lead-free solder is electroplated through the resist mask on the NiFe stud. Sequential electroplating of the solder components, followed by mixing upon reflow, is an alternative to direct plating of the alloy.

The resist is removed.

The thin blanket Ni or NiFe and the CrCu are removed by selective electroetching, chemical etching, RIE or ion milling.

The TiW or Cr is removed by chemical etching or by RIE or ion milling.

The solder is reflowed in a n appropriate atmosphere.

The wafer is dice d into chips, which are joined to carrier employing a suitable flux.

Thus, while there have been shown and described and pointed out fundamental novel features of the invention as applied to currently preferred embodiments thereof, it will be understood that various omissions, substitutions and changes in the form and details of the method and product illustrated, and in their operation, may be made by those skilled in the art without departing from the spirit of the invention. In addition it is to be understood that the drawings are not necessarily drawn to scale. It is the intention, therefore, to be limited only as indicated by the scope of the claims appended herewith and equivalents thereof.

What we claim and desire to protect by Letters Patent is:

1. An interconnection structure suitable for flip-chip attachment of microelectronic device chips to packages, comprising:

a two-layer ball-limiting metallurgy comprising an adhesion/barrier layer and a copper-free solderable layer wherein said adhesion/barrier layer is between a microelectronic device and said copper-free solderable layer and wherein said copper-free solderable layer is of a metal selected from the group consisting of Ni, Co, Fe, NiFe, NiCo and NiCoFe, each said metal from said group being sufficiently non-reactive with components of a tin-containing lead free solder, such that said copper-free solderable layer remains after being placed in contact therewith in a soldering action; and one or more lead-free solder balls selectively situated on said copper-free solderable layer, said lead-free solder balls consisting of tin as the predominant component and one or more alloying components selected from the group consisting of Bi, Ag and Sb, whereby said lead-free solder ball substantially avoids alpha particle emission and induced soft logic errors which result therefrom.

2. The interconnection structure defined in claim 1 wherein said one or more alloying components of said lead-free solder ball are in the ranges of about 1 to 20% for Bi, 1 to 5% for Ag and 1 to 10% for Sb.

3. The interconnection structure defined in claim 2 wherein said one or more alloying components of said lead-free solder ball are about 5% Bi, 3.5% Ag or 5% Sb.

4. The interconnection structure defined in claim 1 wherein the composition of said solderable layer is at least 20% Fe and the balance is Ni.

5. The interconnection structure defined in claim 4 wherein the composition of said solderable layer is about 50% Fe and about 50% Ni.

6. An interconnection structure suitable for flip-chip attachment of microelectronic device chips to packages, comprising:

a two-layer ball-limiting metallurgy comprising an adhesion/barrier layer and a copper-free solderable layer wherein said adhesion/barrier layer is between a microelectronic device and said copper-free solderable layer and wherein said copper-free solderable layer is of a metal selected from the group consisting of Ni, Co, Fe, NiFe, NiCo and NiCoFe, each said metal from said group being sufficiently non-reactive with components of a tin-containing lead free solder, such that said copper-free solderable layer remains after being placed in contact therewith in a soldering action; and one or more lead-free solder balls selectively situated on said copper-free solderable layer, said lead-free solder balls consisting of tin as the predominant component, one or more alloying components selected from the group consisting of Bi, Ag and Sb, and one or more additional alloying components selected from the group consisting of Zn, In, Ni, Co, and Cu in the range of about 0.5 to 5% for Zn, 0.5 to 5% for Ni, 0.5 to 5% for Co, 0.5 to 5% for Cu and 0.5 to 10% for In, whereby said lead-free solder ball substantially avoids alpha particle emission and induced soft logic errors which result therefrom.

7. An interconnection structure suitable for flip-chip attachment of microelectronic device chips to packages, comprising:

a three-layer ball-limiting metallurgy comprising an adhesion/barrier layer, an adhesion layer on top of said adhesion/barrier layer and a copper-free solderable layer wherein said adhesion/barrier layer is between a microelectronic device and said adhesion layer and wherein said copper-free solderable layer is of a metal selected from the group consisting of Ni, Co, Fe, NiFe, NiCo and NiCoFe, each said metal from said group being sufficiently non-reactive with components of a tin-containing lead free solder, such that said copper-free solderable layer remains after being placed in contact therewith in a soldering action; and one or more lead-free solder balls selectively situated on said copper-free solderable layer, said lead-free solder balls consisting of tin as the predominant component and one or more alloying components selected from the group consisting of Bi, Ag and Sb, whereby said lead-free solder ball substantially avoids alpha particle emission and induced soft logic errors which result therefrom.

8. The interconnection structure defined in claim 7 wherein said one or more alloying components of said lead free solder ball are in the ranges of about 1 to 20% for Bi, 1 to 5% for Ag and 1 to 10% for Sb.

9. The interconnection structure defined in claim 8 wherein said alloying components of said lead-free solder ball are about 5% Bi, 3.5% Ag or 5% Sb.

10. The interconnection structure defined in claim 7 wherein the composition of said solderable layer is at least 20% Fe and the balance is Ni.

11. The interconnection structure defined in claim 10 wherein the composition of said solderable layer is about 50% Fe and about 50% Ni.

12. An interconnection structure suitable for flip-chip attachment of microelectronic device chips to packages, comprising:

a three-layer ball-limiting metallurgy comprising an adhesion/barrier layer, an adhesion layer on top of said adhesion/barrier layer and a copper-free solderable layer wherein said adhesion/barrier layer is between a microelectronic device and said adhesion layer and wherein said copper-free solderable layer is of a metal selected from the group consisting of Ni, Co, Fe, NiFe, NiCo and NiCoFe, each said metal from said group being sufficiently non-reactive with components of a tin-containing lead free solder, such that said copper-free solderable layer remains after being placed in contact therewith in a soldering action; and one or more lead-free solder balls selectively situated on said copper-free solderable layer, said lead-free solder balls consisting of tin as the predominant component, one or more alloying components selected from the group consisting of Bi, Ag and Sb, and one or more additional alloying components selected from the group consisting of Zn, In, Ni, Co and Cu in the range of about 0.5 to 5% for Zn, 0.5 to 5% for Ni, 0.5 to 5% for Co, 0.5 to 5% for Cu and 0.5 to 10% for In, whereby said lead-free solder ball substantially avoids alpha particle emission and induced soft logic errors which result therefrom.

* * * * *